United States Patent
Afgani et al.

(10) Patent No.: US 8,175,829 B2
(45) Date of Patent: May 8, 2012

(54) ANALYZER FOR SIGNAL ANOMALIES

(75) Inventors: Mostafa Afgani, Edinburgh (GB); Sinan Sinanovic, Edinburgh (GB); Harald Haas, Edinburgh (GB)

(73) Assignee: Agilent Technologies, Inc., Santa Clara, CA (US)

( * ) Notice: Subject to any disclaimer, the term of this patent is extended or adjusted under 35 U.S.C. 154(b) by 492 days.

(21) Appl. No.: 12/413,721

(22) Filed: Mar. 30, 2009

(65) Prior Publication Data

US 2009/0248336 A1 Oct. 1, 2009

Related U.S. Application Data

(60) Provisional application No. 61/040,275, filed on Mar. 28, 2008.

(51) Int. Cl.
*G01R 29/26* (2006.01)
*G01R 29/02* (2006.01)
*G01R 29/00* (2006.01)
*G06F 19/00* (2011.01)

(52) U.S. Cl. .......... 702/69; 324/102; 375/224; 375/227; 702/85; 702/189; 708/105; 708/200

(58) Field of Classification Search .......... 73/432.1, 73/865.8; 324/72, 76.11, 76.12, 76.38, 102; 370/241, 252; 375/224, 227; 702/1, 57, 702/66, 69, 85, 107, 127, 182, 187, 189; 708/100, 105, 131, 160, 200, 800, 801; 714/1, 714/47.1, 48, 100

See application file for complete search history.

(56) References Cited

U.S. PATENT DOCUMENTS

| 3,491,340 | A  | * | 1/1970 | Kinkel et al. ........... 714/47.1 |
| 6,024,486 | A  | * | 2/2000 | Olarig et al. ........... 714/763 |
| 7,688,984 | B2 | * | 3/2010 | De Callafon ........... 381/71.11 |
| 2007/0086598 | A1 | * | 4/2007 | De Callafon ........... 381/71.11 |

OTHER PUBLICATIONS

D. Thomson, "Spectrum Estimation and Harmonic Analysis," Proc. IEEE, vol. 70, No. 9, pp. 1055-1096, Sep. 1982.
H. Shimazaki et al., "Method for Selecting the Bin Size of a Time Histogram," Neural Computation, vol. 19, No. 6, pp. 1503-1527, Jun. 2007.
R. Krichevsky et al., "The Performance of Universal Encoding," IEEE Transaction on Information Theory, vol. 27, No. 2, pp. 199-207, Mar. 1981.
J. Mitola III, "Cognitive Radio: An Integrated Agent Architecture for Software Defined Radio," Ph. D. dissertation, Royal Institute of Technology (KTH), May 2000.
M. Basseville, "Distance Measures for Signal Processing and Pattern Recognition," Signal Processing, vol. 18, No. 4, pp. 349-369, Sep. 1988.

* cited by examiner

*Primary Examiner* — Edward Cosimano

(57) ABSTRACT

A signal analyzer includes a divergence detector for detecting periodic interference in a signal, an information detector for detecting a random event in the signal, and output circuitry for providing compensation for the periodic interference and the random event.

15 Claims, 9 Drawing Sheets

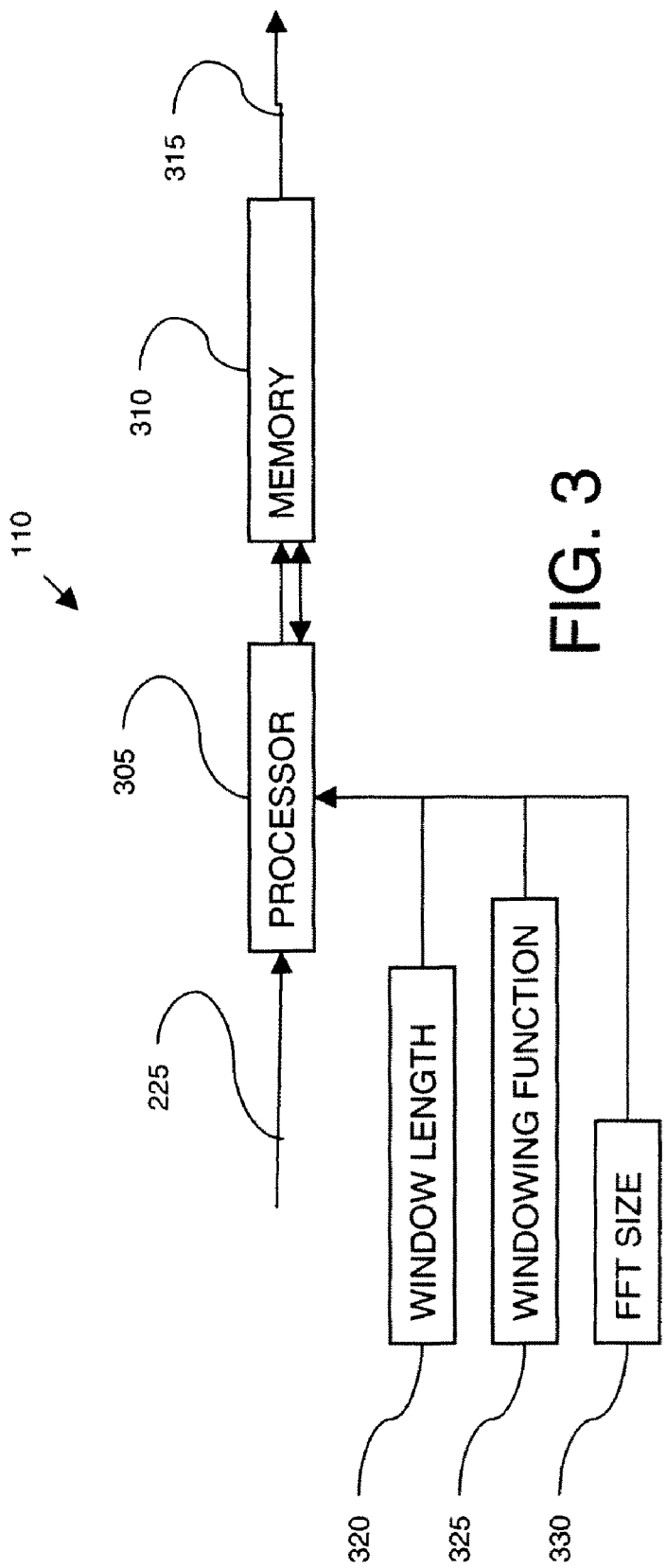

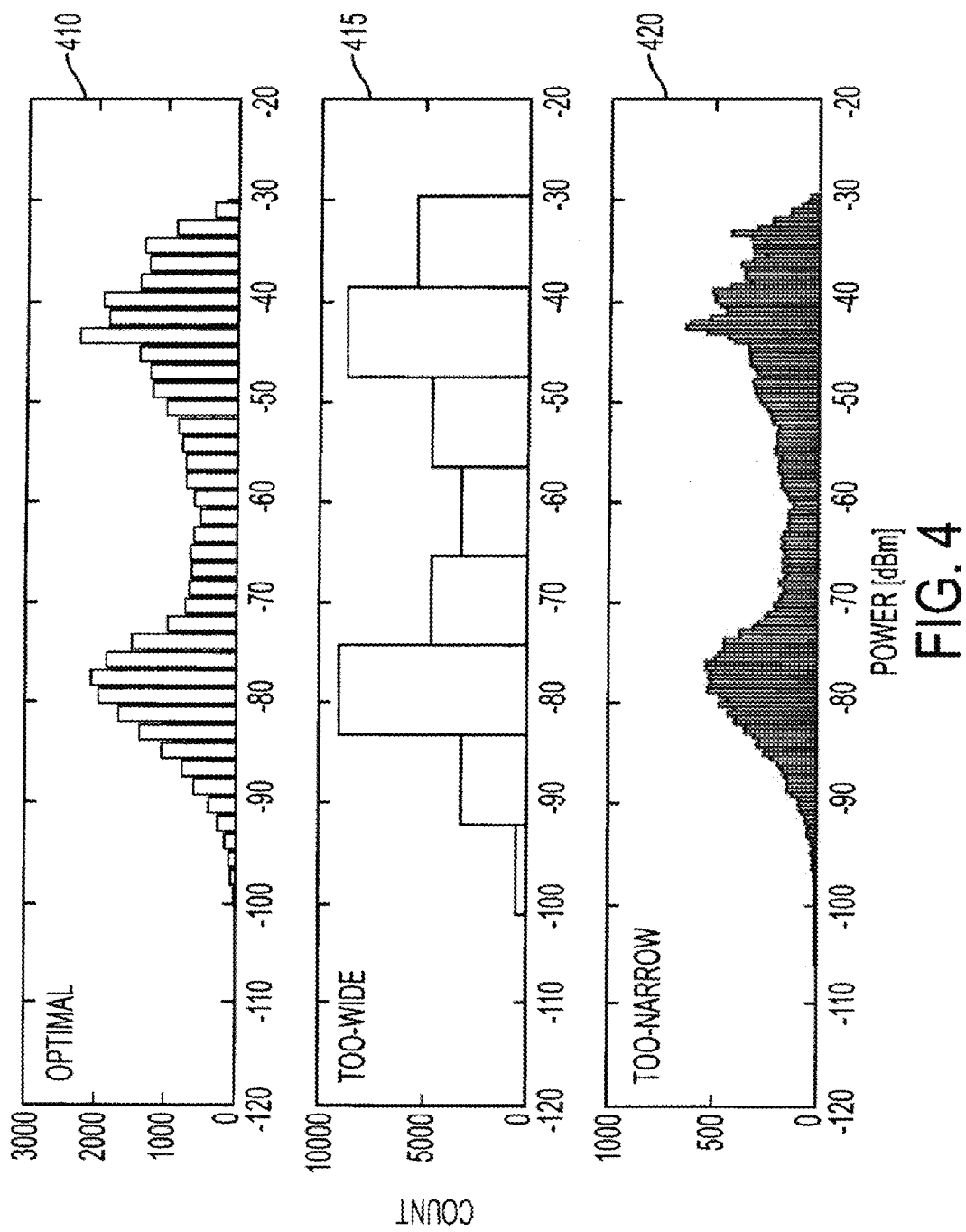

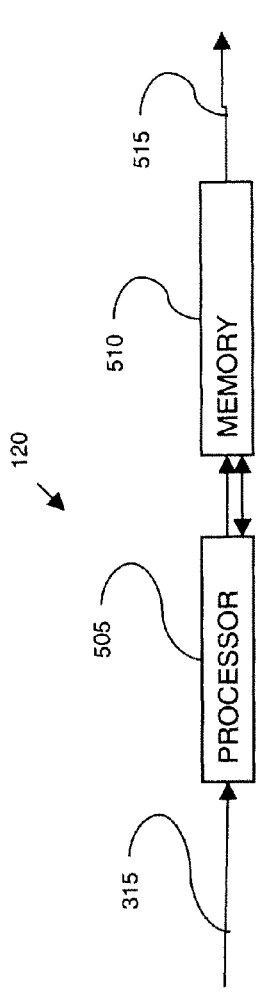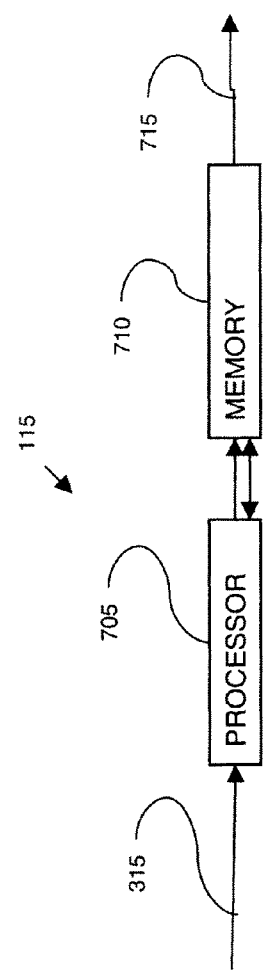

ANALYZER FOR SIGNAL ANOMALIES

This application claims the benefit of expired U.S. Provisional Application No. 61/040,275 filed 28 Mar. 2008, which is incorporated by reference herein in its entirety.

The subject matter described herein relates generally to detecting anomalies in electrical signals.

BACKGROUND

It is not uncommon for signals to undergo random, spurious distortion during transmission. Such problems are inherently difficult to detect and solve using traditional methods at least because of the random and ephemeral nature of the distortion and a finite amount of capture memory available in present day analyzer hardware. Current methodology used to troubleshoot distortion problems usually includes capturing large, disjoint sets of sample data and analyzing each one for clues. This approach can be crude, inefficient, and often technically unfeasible due to unreasonable hardware requirements, for example, large amounts of memory and processing power. One practical exemplary application is cognitive radio. Cognitive radio is a term used to describe intelligent wireless communications devices built on top of software defined radio platforms. The purpose of such a device is to provide both reliable communication links and efficient utilization of valuable radio spectrum resources. An ideal system of this type should be capable of learning from and adapting to input stimuli received from the environment.

A detector or method that is capable of analyzing signal waveforms in real-time for anomalous features would be desirable.

SUMMARY

In one exemplary embodiment, a signal analyzer includes a divergence detector configured to detect periodic interference in a signal, an information detector configured to detect a random event in the signal, and output circuitry configured to provide compensation for the periodic interference and the random event.

In another exemplary embodiment, a method of analyzing a signal includes detecting periodic interference in a signal, detecting a random event in the signal, and compensating for the periodic interference and the random event.

BRIEF DESCRIPTION OF THE DRAWINGS

The foregoing aspects and other features of the presently disclosed embodiments are explained in the following description, taken in connection with the accompanying drawings, wherein:

FIG. 3 shows a block diagram of an exemplary signal pre-processor for use with the disclosed embodiments;

FIG. 4 illustrates the effect of picking various bin widths on a histogram;

FIG. 5 shows an exemplary information detector according to the disclosed embodiments;

FIG. 7 shows an exemplary divergence detector according to the disclosed embodiments;

DETAILED DESCRIPTION

Figure 1:
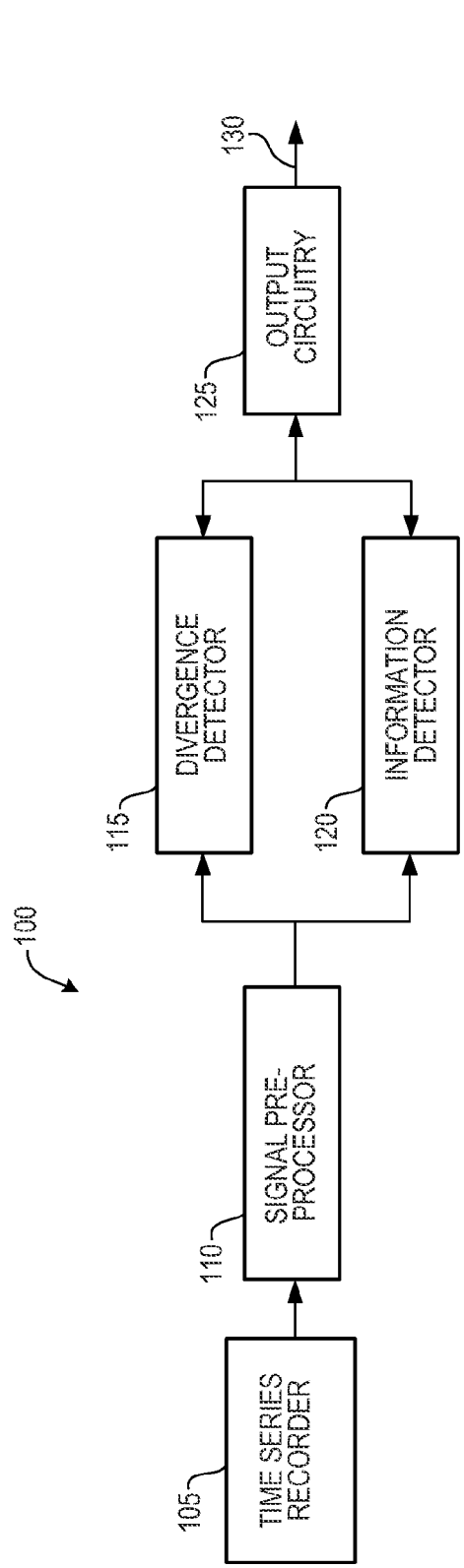
FIG. 1 shows a block diagram of a system suitable for practicing the disclosed embodiments.

FIG. 1 shows a block diagram of a system 100 suitable for practicing the embodiments disclosed herein. Although the presently disclosed embodiments will be described with reference to the drawings, it should be understood that they may be embodied in many alternate forms. It should also be understood that in addition, any suitable size, shape or type of elements or materials could be used.

Transmission distortions are generally induced through physical aspects of the transmission including the receiving device front-end. As a result, applying analysis techniques to the physical layer (PHY) signal envelope may yield significant results. Starting with a time series of the signal, in one example, a representation of power over time, computation of a signal spectrogram generally produces the underlying time-frequency structure. A statistical analysis of the spectrogram may then be performed provided that the amount of prior knowledge and assumptions about the underlying system are kept to a minimum.

The disclosed embodiments generally include two types of detectors or analysis techniques. The first makes use of information conveyed by a random event itself, referred to as an information detector, or an information detection technique. This detector or technique may be suitable for detecting individual low probability events and does not require the signal to be periodic. The second detector or analysis technique, referred to as a divergence detector, or a divergence detection technique, may be suitable for detecting anomalies in a periodic signal.

An exemplary analyzer 100 is shown in FIG. 1. The analyzer 100 may include a number of components such as a time series recorder 105, a signal pre-processor 110, a divergence detector 115, and an information detector 120. The output of the divergence detector 115 and the information detector 120 are provided to output circuitry 125 which provides an output 130 which may be used for further analysis or to modify operations to compensate for the anomalies detected. It should be understood that each component of analyzer 100 may be implemented in any combination of hardware and software.

Figure 2:
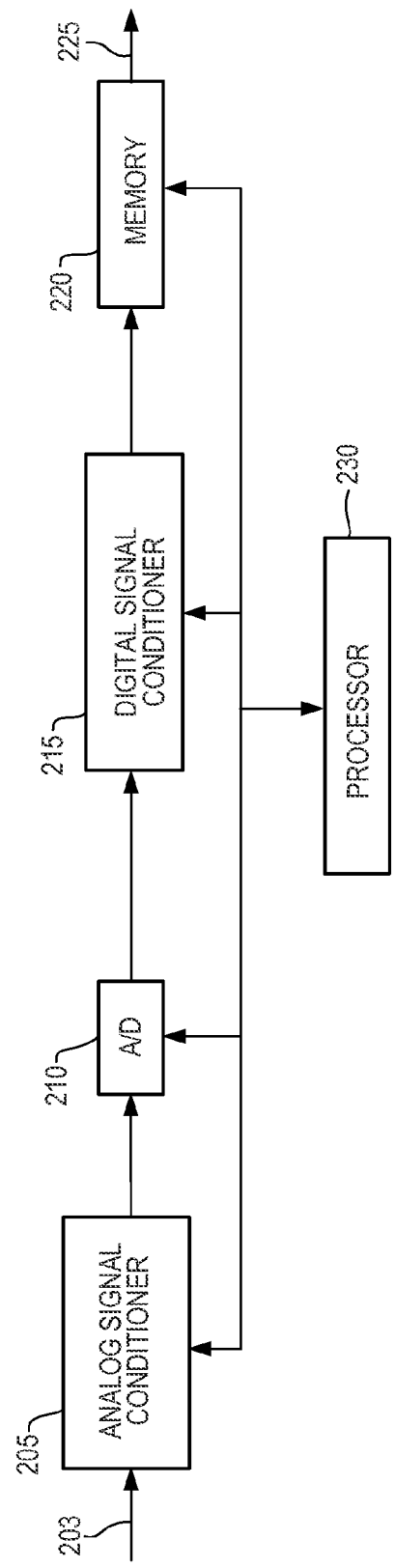
FIG. 2 shows a block diagram of an exemplary time series recorder for use with the disclosed embodiments.

An exemplary time series recorder 105 is shown in FIG. 2. The time series recorder 105 may include an analog signal input 203 for receiving the physical layer signal, an analog signal conditioner 205 for conditioning the signal for the analog to digital converter 210, if required, a digital signal conditioner 215 for conditioning the output of the A/D if required, a memory 220 for storing a plurality of representations of the conditioned signal over time and providing an output 225, and a processor 230. Memory 220 may also include a computer readable medium for storing a computer readable program for controlling the operations of the processor 230 related to recording the time series.

Referring again to FIG. 1, the signal pre-processor is used to compute a time-frequency decomposition, or spectrogram, of the recorded time series. A spectrogram provides significant information regarding the underlying signal structure thus enabling the detection of unusual signal conditions.

An exemplary signal pre-processor 110 is illustrated in FIG. 3. This embodiment includes a processor 305 for processing the output 225 of memory 220 (FIG. 2) and a second memory 310 for storing the results and providing them through output 315 to the different detectors. Memory 310 may also include a computer readable medium for storing a computer readable program for controlling the processor operations related to generating spectrograms.

There are various techniques for obtaining a spectrogram. Generally, the output 225 of memory 220 (FIG. 2) may be processed by processor 305 to produce a spectrogram. In some exemplary embodiments, the processor 305 may employ a multitaper spectral estimation procedure. In other embodiments, the processor 305 may employ a short-term Fourier transform (STFT) due to the inherent simplicity of implementation. An STFT technique may also be advantageous because it includes the computation of a series of fast Fourier transforms (FFTs) which may be computed efficiently and in real time.

In order to optimize the STFT output, a number of exemplary parameters may be considered. Each of the exemplary parameters may be provided by any combination of user selected parameters, parameters from one or more tables, or may automatically calculated by the processor. The exemplary parameters may include:

Window length 320—The window length 320 may be provided as an input to be utilized by the processor 305. The amount of detail available in a spectrogram (i.e. the resolution) may be directly affected by the amount of data used to compute each segment of the STFT. A shorter window may provide a much higher time resolution (more accurate time localization of events) but poor frequency resolution. A wider window may have the opposite effect for a similarly sized FFT.

Windowing function 325—If the FFTs are carried out on the signal segments without the application of an explicit windowing function (scaling of the time-series segment), a rectangular (boxcar) windowing function is implied. The boxcar windowing function may be undesirable as it has very poor spectral leakage characteristics. Functions from the raised cosine family such as the Hann (also known as Hanning) or Hamming windows may provide alternatives capable of producing higher quality spectral estimates. Other commonly used windowing functions may include Bartlett, Blackman, Kaiser, etc. Thus, the application of a specific windowing function may be advantageous.

FFT size 330—The FFT size 330 generally controls the achievable frequency resolution, that is, a higher point FFT may produce a more fine-grained result than a smaller one. To avoid possibly discarding valid data, the FFT size should be specified at least as large as the number of samples in the windowed signal. In addition, specifying an FFT size 330 too large may result in having to zero pad the original data.

It should be noted that other parameters may also be considered and that optimal values for any parameter may be application dependent.

As the detection mechanisms described herein are statistical in nature, computation of event histograms and related probability mass functions (PMF) may be integral to the techniques described herein. Although the construction of a histogram may appear trivial, the choice of an appropriate bin size (for events that arise from a continuous random variable) is not. For the information content based method, narrower bin widths will make for a more sensitive system; however, the rate of false-positives will also increase as there are potentially more bins with fewer events in them.

FIG. 4 illustrates the effect of picking various bin widths on a histogram. This example includes modeling a power distribution in a spectrogram of a wireless LAN (WLAN) signal. As shown, when the bin width is too wide 415, subtle variations in the distribution are not captured effectively. On the other hand, if the bin width is too narrow 420, the resulting histogram may be "noisy." Thus, an optimal bin width 410 provides an accurate representation of the power distribution. Once the histogram is constructed, the probability mass function may be evaluated, in particular when performing the divergence detection. If there are empty bins in the histogram, there may be events in the probability mass function that have a probability of zero. When divergence between two probability mass functions is evaluated, divisions involving zeros would return erroneous results. In order to avoid problems associated with empty bins, in one embodiment the histogram bins may be preloaded with an arbitrary number such that there can be no empty bins. An analysis of the present literature finds that preloading each bin with an initial value of 0.5 may be advantageous.

Returning to FIG. 1, when the spectrogram has been generated, the disclosed embodiments provide two detection techniques, information detection for detecting individual low probability events and divergence detection for detecting anomalies in a periodic signal.

An exemplary information detector 120 is illustrated in FIG. 5. This embodiment includes a processor 505 for analyzing the spectrogram output 315 of memory 310 (FIG. 3) and a third memory 510 for storing the analysis results and for providing the results through output 515 to output circuitry 125. Third memory 510 may also include a computer readable medium for storing a computer readable program for controlling the processor operations related to detecting information from one or more spectrograms.

The information detector 120 is based on the principle that the amount of information, I(x), conveyed by any random event, x, is directly related to its probability of occurrence, p(x):

$$I(x)=-\log 2[p(x)] \quad (1)$$

This implies that an event with a very high probability of occurrence carries very little information. On the other hand, a large amount of information is conveyed by the occurrence of rare events (i.e. I(x).fwdarw.infin. as p(x).fwdarw.0). The quantity, I(x) is always positive and monotonically increasing with decreasing values of event probability—properties that are desirable in a detection metric.

Unusual features in a signal may be detected through measurements of the information content of events as follows:

The characteristics of an event must be defined. The event thus described should have only non-overlapping "states".

The reference event probabilities (and hence the information content) from an event histogram of a known clean signal should be determined.

Once training is complete, the algorithm is applied to the signal under test and the event histogram of the known clean signal is updated with the new events encountered and the associated information content is computed.

If an event has not been encountered before, its probability will be much lower than events already encountered and its information content will be much higher than events already encountered.

An unusual event is detected when the information content of an event is higher than some predefined threshold.

Figure 6:
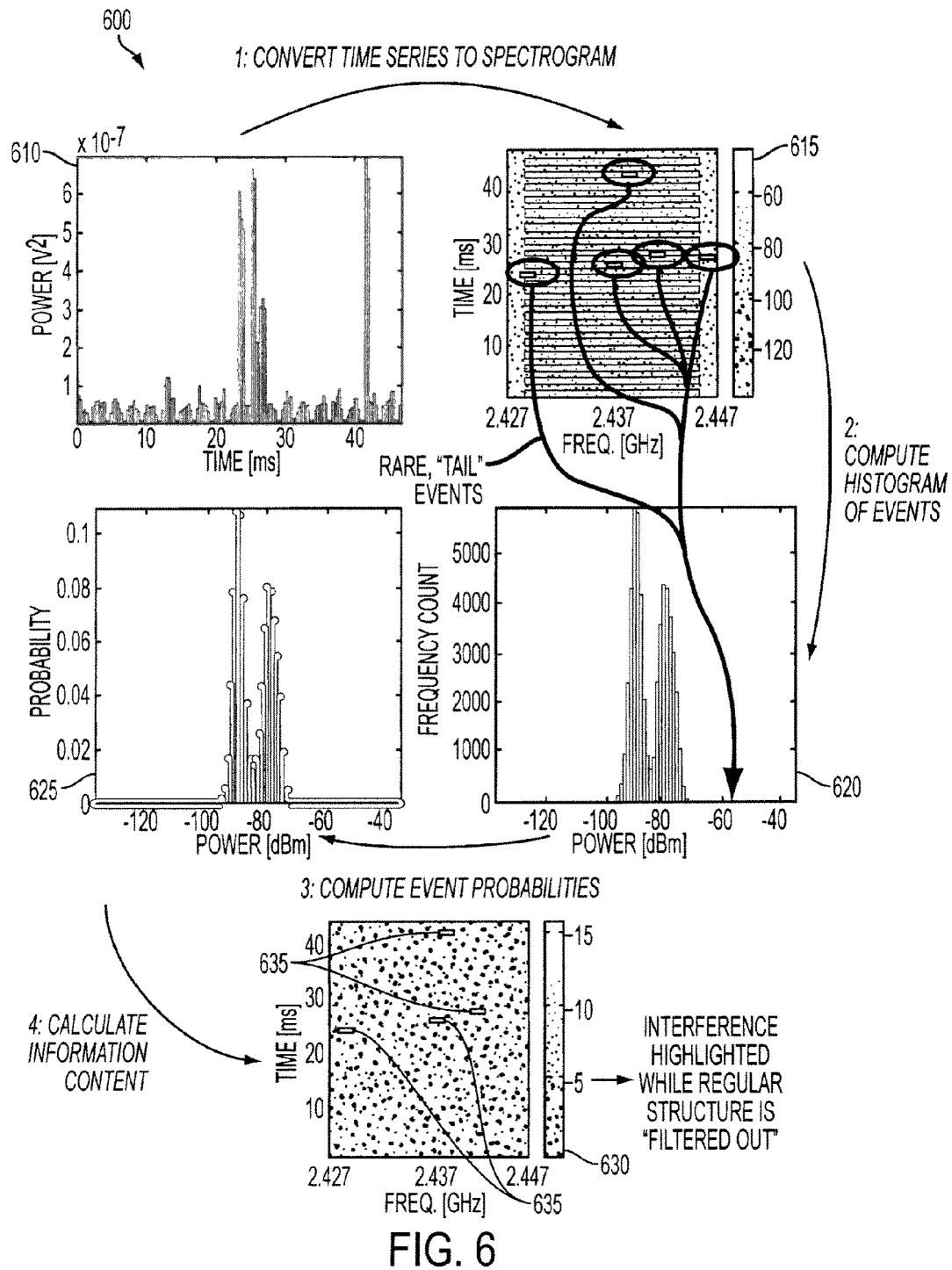
FIG. 6 shows an exemplary information detection method performed according to the disclosed embodiments.

The information detection method 600 performed by the analyzer 100 is illustrated in FIG. 6. In this illustration, an event is defined as the average power within a predetermined time-frequency grid. The amount of information conveyed by the occurrence of an event may be utilized to detect unusual events, indicated by low probabilities and thus high information content. Significant events may be identified by events having a probability below a certain threshold.

A time series 610 is collected by the time series recorder 105. The signal pre-processor 110 converts the time series 610 to a spectrogram 615. The information detector 120 then computes a histogram of events 620 using the procedure described above. Once the histogram 620 has been computed, event probabilities 625 are computed. The information content 630 is determined from the event probabilities 625 and the events 635 are identified.

As mentioned above, the other detection technique described in the disclosed embodiments is divergence detection, for detecting anomalies in a periodic signal. An exemplary divergence detector 115 is illustrated in FIG. 7. This embodiment includes a processor 705 for analyzing the spectrogram output 315 of memory 310 (FIG. 3) and a fourth memory 710 for storing the analysis results and for providing the results through output 715 to output circuitry 125. Fourth memory 710 may also include a computer readable medium for storing a computer readable program for controlling the processor operations related to divergence detection as described herein.

The divergence detector 115 may utilize a Kullback-Leibler divergence metric to detect irregularities within a regular, periodic structure, in contrast to a random event. The Kullback-Leibler divergence (KL-divergence) metric, referred to as D, is generally a measure of the difference between two probability distributions, for example, p(x) and q (x):

$$D(pq)=x.\text{di-electcons}.Xp(x)\log 2p(x)q(x)(2) \qquad \#\#EQU00001\#\#$$

Using a base-2 logarithm (among other things) allows the divergence to be measured in bits. The divergence between a set of probability mass functions is generally not symmetric. D (p.parallel.q)=D (q.parallel.p)=0 if and only if p(x) and q(x) are identical; otherwise the divergence is always a positive, non-zero number.

The Kullback-Leibler divergence may be employed for the detection of anomalies in a periodic signal as follows:

The period of the signal under test is determined

Two signal windows of the same size may be determined. The inter-window separation distance must be the same as the signal period.

An event must be defined, similar to the case of the information detection technique, above.

The probability distribution or probability mass function of events within each of the signal windows is computed and the associated KL-divergence is computed.

An unusual event is indicated when the KL-divergence between the two windows is larger than some predefined threshold. If the divergence is below the threshold, the windows may be advanced to the next set of data.

Figure 8:
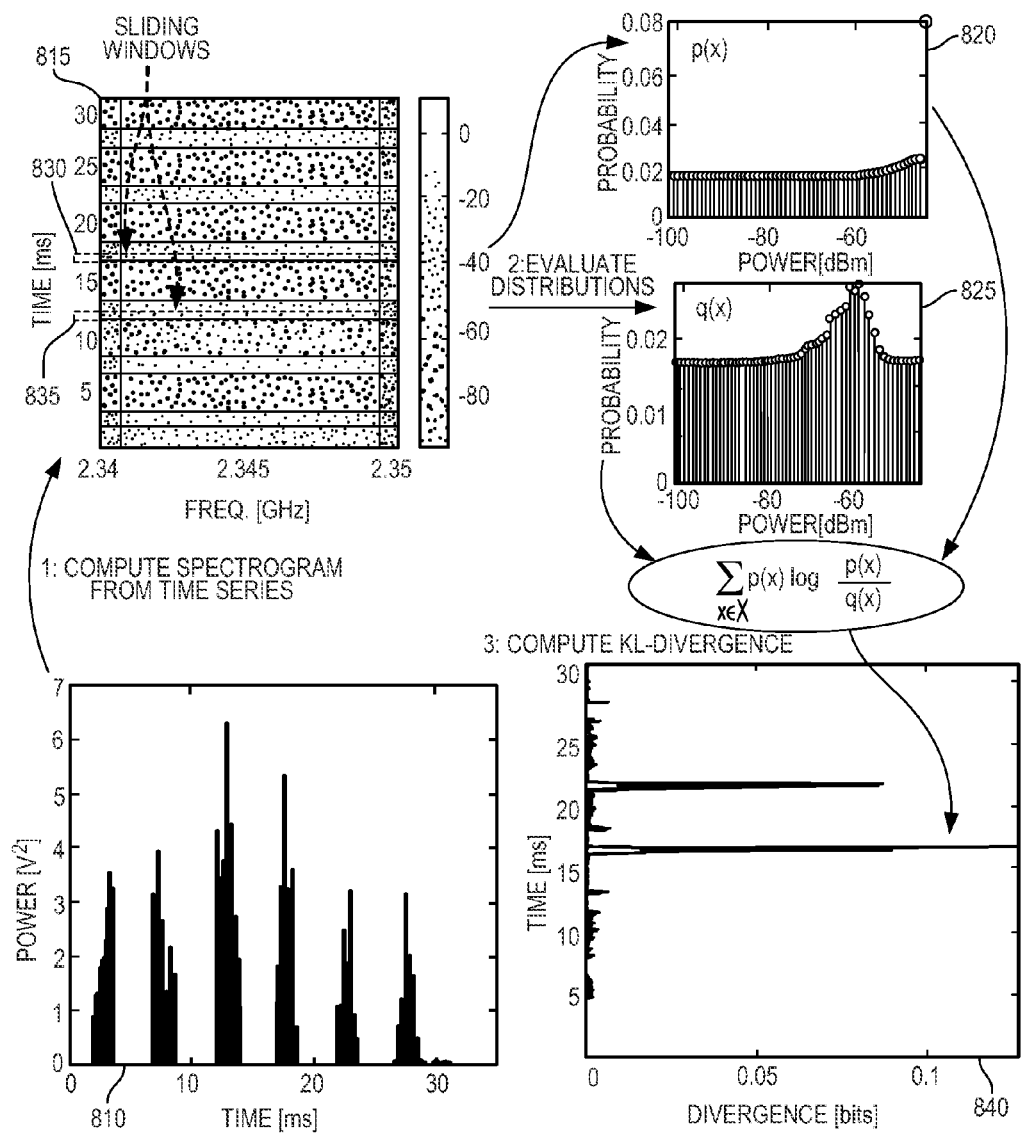
FIG. 8 shows an exemplary divergence detection method performed according to the disclosed embodiments.

FIG. 8 illustrates the divergence detection method. In FIG. 8, an event is defined as the average signal power within a predefined time-frequency grid, similar to the illustration in FIG. 6. If the divergence between two probability mass functions drawn from analogous portions of a periodic signal exceed a predefined threshold, detection of an unusual event is indicated.

In FIG. 8, a time series 810 is collected by the time series recorder 105. The signal pre-processor 110 converts the time series 810 to a spectrogram 815. The divergence detector 115 then computes probability mass functions 820, 825 for the two defined signal windows 830, 835 using the procedure described above. Once the probability mass functions 820, 825 have been determined, the divergence 840 is computed. Events are identified that exceed certain predetermined thresholds.

By having the probability mass function computing windows separated by the signal period, the scheme compares analogous portions of subsequent frames in the signal. As a result, the only a priori knowledge needed is the signal period.

While the information detection scheme described above is useful for the detection of individual low-probability events, it is unsuitable for the detection of conditions where regular events are distributed in an unusual way (e.g. out of sequence). By taking into account the "group behavior" of events through probability mass functions, the KL divergence technique provides a complementary approach for the detection of a wider range of signal anomalies.

Both the information detector 120 and the divergence detector 115 provide outputs 515, 715 that define the characteristics of the detected events. These characteristics may be used in various applications to compensate for the particular events. Using the cognitive radio example mentioned above, transmitter or receiver operations may be modified to compensate for detected disturbances to ensure reliable communications or to provide a specified quality of service.

Exemplary signals known to contain anomalous events may be used to evaluate the performance of the proposed information and divergence detectors.

Figure 9:
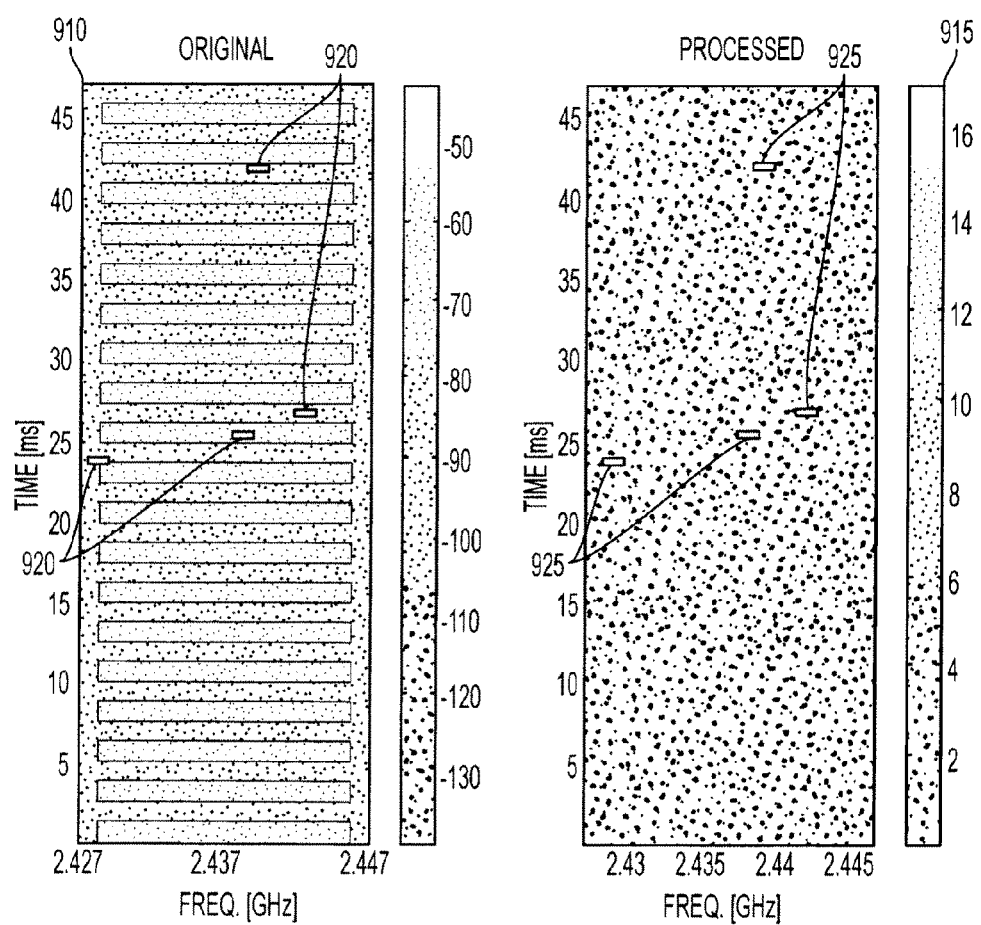
FIG. 9 shows an exemplary practical application where a system experiences short-lived, spurious interference.

FIG. 9 shows an exemplary practical application, a system experiencing short-lived, spurious interference. The signals have been generated by a WLAN emulator and the interference has been generated by a Bluetooth device. A spectrogram 910 of the wireless LAN signal with interference 920 from the Bluetooth device is shown on the left. Darker shades represent lower power levels than lighter ones. On the right, information content 915 associated with events (average power) in the signal is shown. The interference (unusual events 925) is magnified while the underlying WLAN signal is subdued—allowing for an information content threshold based detection mechanism. Darker shades represent lower information content compared to lighter shades.

The signal spectrogram 910 clearly shows the frequency-hopping nature of the Bluetooth device. As this is a clear case of detecting unusual events (the Bluetooth power signature is different from that of the WLAN signal), the information detector is an ideal choice. The detection parameters are shown in Table 1.

TABLE-US-00001 TABLE 1 Spectrogram: Windowing Hamming Window length 4 .mu.s (one symbol) FFT size Next power of 2 larger than the window Histogram: Number of bins 10 Bins preloaded No (unnecessary) Preload value N/A 4 µs is a natural choice for the STFT window length because it provides individual symbol level resolution (symbols making up WLAN frames typically have a duration of 4 .mu.s). Experiments indicate that 10 is a good choice for the number of histogram bins for this particular problem—fewer bins increase the probability of missed detection while more bins increase the probability of false positives.

The result of applying the algorithm to the Bluetooth tainted WLAN signal is shown next to the original signal spectrogram 910 in FIG. 9. The plot shows how the information content varies across the signal—with darker shades representing less information than the lighter shades. It is immediately obvious that the amount of information associated with the interference events is much larger than the levels associated with the underlying WLAN signal. It appears that the information detection technique effectively highlights the unusual events while subduing the regular features of the test signal—allowing for a (user configurable) information content threshold based trigger system. Upon detecting the anomalous events, Bluetooth or WLAN system operations may be modified to compensate.

Figure 10:
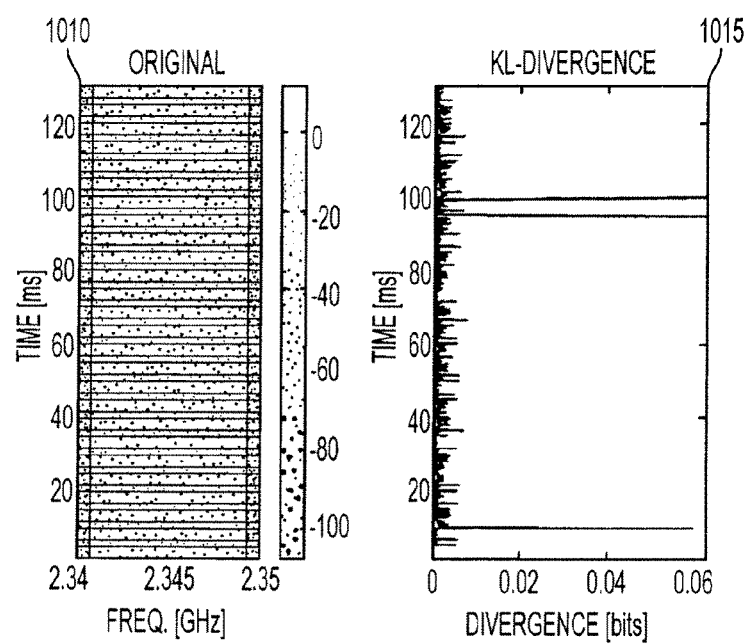
FIG. 10 shows another exemplary application where a signal structure experiences sudden changes.

FIG. 10 shows another exemplary application where a WiBro signal structure experiences sudden changes. Although invisible in the spectrogram 1010, additional command sequences at around 4.76 ms and 94.76 ms cause a power control loop to be initiated. If an event is defined as the average power over a certain predefined time-frequency grid, the information content based scheme would fail as there are no unusual events. The transmit power used in the command sequence is the same as any other part of the frame. An approach that takes into account the signal's structural and positional relevance is required, such as the KL-divergence based scheme described above. The divergence is shown in diagram 1015

Table II lists the parameters used for the computation of the KL-divergence between segments of the test signal. The logic behind the choice of the general parameters is similar to that used for the information detection scheme above. The probability mass function computing window length is set to 78 .mu.s to take into account a statistically significant data set. TABLE-US-00002 TABLE II Spectrogram: Windowing function Hamming Window length 25.6 .mu.s (one symbol) FFT size Next power of 2 larger than the window Histogram: Number of bins 32 Bins preloaded Yes Preload value 0.5 KL-divergence: Window length 78 .mu.s (three symbols) Window separation 5 ms (Frame period)

Referring again to FIG. 10, the left side shows the spectrogram 1010 of the WiBro signal with power control inducing commands. As mentioned above, the extra commands (at 4.76 ms and 94.76 ms) are nearly impossible to detect with the unaided eye. Darker shades represent lower power levels than lighter ones. Referring to the diagram on the right, the presence of the unusual events are immediately revealed by the KL-divergence analysis 1015 of the signal. Each event is responsible for two peaks; this is a side effect of the two windows used to compute the KL-divergence.

The result obtained shown in FIG. 10 depicts a more than a six-fold difference between the background divergence levels and the peaks produced by the events of interest. Thus the divergence detection scheme is particularly suitable for detecting these types of anomalies.

As mentioned above, every anomaly in the signal produces two peaks in the KL-divergence, with the first peak being the "true" one. This is a side effect of the two signal windows needed for the calculations—each window produces a peak as it passes over the anomaly. There is only one peak associated with the first event as, at the beginning of the analysis, the "leading" window is positioned beyond it. The fact that each signal irregularity gives rise to two peaks in the divergence may be advantageous as detection of the second peak may be used to reinforce the detection of the first peak as the peaks should always be separated by a duration equal to the signal period. Upon detecting the anomalous events, operations of the WiBro system may be modified to provide compensation.

When using the divergence detection scheme, changing the window separation distance to be the same as the length of either of the two windows (i.e. both windows are adjacent to one another), results in a signal boundary detector.

Figure 11:
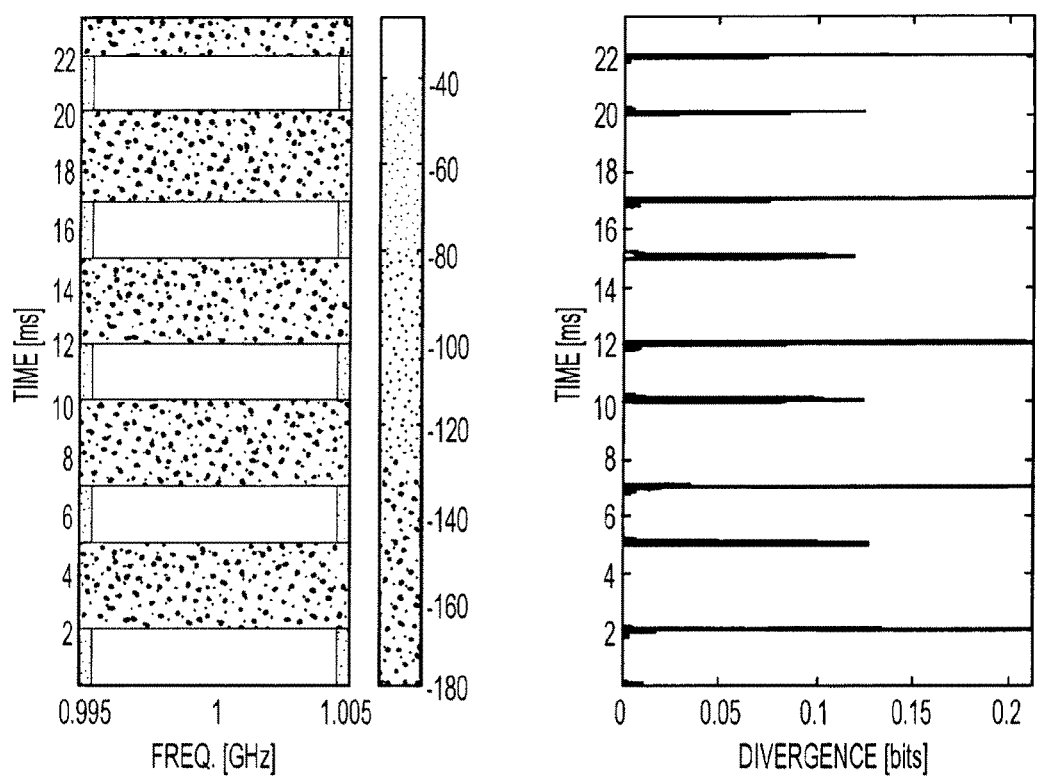
FIG. 11 shows an example of boundary detection using a divergence metric.

An example of boundary detection using a KL-divergence metric is shown in FIG. 11. The resolution of the detector is dependent on the probability mass function window length, that is, the window must be smaller or equal to the length of the smallest detectable feature required.

The ability to detect signal anomalies and signal boundaries using the same framework is advantageous because this may be implemented as a self-learning scheme that uses boundary detection to determine the signal period prior to executing in the anomaly detection mode—nullifying the need for any user input.

The disclosed embodiments include robust statistical methods for detecting anomalies in electrical signals using two complementary analysis techniques. An information detection technique may be used for detecting individual, low probability events. A divergence detection technique may be used for detecting anomalies in a periodic signal. Both techniques showed satisfactory results when analyzing exemplary signals known to contain anomalous events.

It should be understood that the foregoing description is only illustrative of the present embodiments. Various alternatives and modifications can be devised by those skilled in the art without departing from the embodiments disclosed herein. Accordingly, the embodiments are intended to embrace all such alternatives, modifications and variances which fall within the scope of the appended claims.

What is claimed is:

1. A signal analyzer comprising:
a divergence detector configured to detect periodic interference in a signal;
an information detector configured to detect a random event in the signal; and
output circuitry configured to provide compensation for the periodic interference and the random event.

2. The signal analyzer of claim 1, wherein the divergence detector comprises a processor for computing a Kullback-Leibler divergence of a spectrogram of the signal.

3. The signal analyzer of claim 1, wherein the information detector comprises a processor for determining a probability of the random event and identifying significant events having a probability below a certain threshold.

4. The signal analyzer of claim 1, further comprising:
a time series recorder for recording a time series of the signal;
a signal pre-processor for generating a spectrogram from the time series, wherein the divergence detector utilizes the spectrogram for detecting periodic interference and the information detector utilizes the spectrogram for detecting the random event.

5. The signal analyzer of claim 4, wherein the time series recorder comprises:
an analog signal input for receiving a physical layer signal;
an analog signal conditioner for conditioning the physical layer signal;
an analog to digital converter for digitizing the conditioned signal; and
a memory for storing a storing a plurality of representations of the digitized conditioned signal over time.

6. The signal analyzer of claim 4, wherein the signal pre-processor comprises:
a processor for processing the time series of the signal to yield the spectrogram; and
a memory for storing the spectrogram.

7. The signal analyzer of claim 6, wherein the processor operates to generate a short term Fourier transform of the time series.

8. An analyzer comprising:
a time series recorder for recording a time series of a signal;
a signal pre-processor for generating a spectrogram from the time series;

a divergence detector for detecting periodic interference in the spectrogram;

an information detector for detecting a random event in the spectrogram; and output circuitry for compensating for the periodic interference and the random event in the signal.

9. A method of analyzing a signal comprising:
detecting periodic interference in a signal;
detecting a random event in the signal; and
compensating for the periodic interference and the random event.

10. The method of claim 9, further comprising detecting the periodic interference in the signal utilizing a Kullback-Leibler divergence calculation from a spectrogram of the signal.

11. The method of claim 9, further comprising detecting the random event by calculating a probability of the random event and identifying the random event as significant if the probability is below a certain threshold.

12. The method of claim 9, further comprising:
recording a time series of the signal;
generating a spectrogram from the time series; and
utilizing the spectrogram for detecting the periodic interference and the random event in the signal.

13. The method of claim 9, further comprising:
receiving the signal from a physical transmission layer;
conditioning the physical layer signal;
digitizing the conditioned signal; and
storing a storing a plurality of representations of the digitized conditioned signal over time.

14. The method of claim 9, further comprising:
processing the time series of the signal to yield the spectrogram; and
storing the spectrogram.

15. The method of claim 14, further comprising generating a short term Fourier transform of the time series.

* * * * *